(12) United States Patent
Huang et al.

(10) Patent No.: US 6,304,506 B1
(45) Date of Patent: Oct. 16, 2001

(54) ENERGY-SAVING DEVICE FOR MEMORY CIRCUIT

(75) Inventors: Shih-Huang Huang; Hsin-Pang Lu, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/684,116

(22) Filed: Oct. 6, 2000

(30) Foreign Application Priority Data

Sep. 25, 2000 (TW) .................................................. 89119721

(51) Int. Cl.$^7$ ...................................................... G11C 7/00
(52) U.S. Cl. ............................ 365/205; 365/198; 365/207
(58) Field of Search ..................................... 365/205, 207, 365/198, 189.01

(56) References Cited

U.S. PATENT DOCUMENTS 5,479,374 * 12/1995 Kobayashi et al. ................ 365/233.5
5,590,081 * 12/1996 Shimizu ................................ 365/203
5,646,900 * 7/1997 Tsukude ............................... 365/205
5,657,278 * 8/1997 Lee ..................................... 365/189.09
5,668,762 * 9/1997 Suwa ................................. 365/189.11
5,708,616 * 1/1998 Choi .................................... 365/205

* cited by examiner

Primary Examiner—Hoai V. Ho
(74) Attorney, Agent, or Firm—Thomas, Kayden, Horstemeyer & Risley, LLP

(57) ABSTRACT

An energy-saving device for a memory circuit. The energy-saving device is capable of immediately terminating a local sense amplifier enable signal to a sense amplifier. The energy-saving device employs a plurality of Schmitt triggering circuits with each Schmitt triggering circuit capable of receiving an operational signal and an inverse operational signal and capable of issuing a Schmitt triggering signal to a data-transmission tester. The data-transmission tester will issue a response signal when change in the Schmitt triggering signal is detected. A data-transition-detected pulse is sent from a data-transmission-testing pulse generation circuit to a power shut down signaling circuit to terminate the local sense amplifier enable signal when the data-transmission-testing pulse-generation circuit receives a response signal.

10 Claims, 4 Drawing Sheets

ENERGY-SAVING DEVICE FOR MEMORY CIRCUIT

CROSS-REFERENCE TO RELATED APPLICATION

This application claims the priority benefit of Taiwan application Ser. No. 89119721, filed Sep. 25, 2000.

BACKGROUND OF THE INVENTION

1. Field of Invention

The present invention relates to an energy-saving device for a memory circuit. More particularly, the present invention relates to an energy-saving device capable of turning off the power to the second sense amplifier inside a memory circuit immediately after data transmission.

2. Description of Related Art

FIG. 1 is a diagram showing a conventional memory circuit. As shown in FIG. 1, the memory circuit includes a first sense amplifier 10, a second sense amplifier 12 and an input/output buffer 14. The first sense amplifier 10 sends out two different types of signals NL and NDL to the second sense amplifier 12. After some data processing activities inside the second sense amplifier 12, the data are transmitted to the input/output buffer 14 for output.

The second sense amplifier 12 is triggered by a local sense amplifier enable (LSAE) signal acting through the gate terminals of the NMOS transistors 16, 18 and 20. Since the output terminal of an inverter 22 inside the input/output buffer 14 is connected to the input terminal of another inverter 24 and vice versa, signal transmitted to the input/output buffer 14 can be retained. Hence, the second sense amplifier 12 must remain active for a definite period before it can be shut off after data transmission has stopped. Because the second sense amplifier 12 includes a plurality of MOS transistors inside, considerable current flows inside the second sense amplifier 12 and hence energy consumption is high.

Although the setting of a delay chain to control the opening and shutting down of the sense amplifier has been proposed to save energy, such a method is constrained by the manufacturing process as well as temperature variations. Consequently, proper timing control of the sense amplifier is very difficult leading to extra power consumption or failures.

SUMMARY OF THE INVENTION

Accordingly, one object of the present invention is to provide an energy-saving device for a memory circuit such that power to a sense amplifier inside the memory circuit is shut off immediately at the end of data transmission. Hence, wasting of energy by the memory circuit is prevented. Moreover, the energy-saving device is immune to temperature and processing variations.

To achieve these and other advantages and in accordance with the purpose of the invention, as embodied and broadly described herein, the invention provides an energy-saving device for a memory circuit. The energy-saving device is capable of immediately terminating a local sense amplifier enable (LSAE) signal to a sense amplifier circuit. The sense amplifier includes a plurality of different operational signals and a plurality of different inverse operational signals.

The energy-saving device comprises a plurality of Schmitt triggering circuits, a plurality of data-transmission testers, a data-transmission-testing pulse-generation circuit and a power shut down signaling circuit.

Each Schmitt triggering circuit receives an operational signal and an inverse operational signal and then outputs a corresponding Schmitt triggering signal. Each data transmission tester is connected to a Schmitt triggering circuit. When a Schmitt triggering signal is received, the data-transmission tester will issue a response signal. The data transmission testers are connected to the data-transmission-testing pulse-generation circuit. When the data-transmission-testing pulse-generation circuit receives a response signal from any one of the data transmission testers, a data-transition-detected pulse is issued. The power shut down signaling circuit is connected to the data-transmission-testing pulse-generation circuit. On receiving a data-transition-detected pulse, the power shut down signaling circuit will immediately terminate the local sense amplifier enable (LSAE) signal.

In this invention, Schmitt triggering circuits and data transmission testers are used. Since the circuits have some internal magnetic hysteresis, shut down will occur only after a definite interval. Hence, erroneous decisions due to impulses are prevented.

The data-transmission-testing pulse-generation circuit further includes a plurality of NMOS transistors, a first inverter, a NOR gate, an invert-delay device, a PMOS transistor and a second inverter. The gate terminals of the NMOS transistors are connected to the respective data transmission testers for receiving a response signal. All the source terminals of the NMOS transistors are connected to a low voltage. The input terminal of the inverter is connected to a low voltage and the output terminal of the inverter is connected to the drain terminal of the NMOS transistor. The NOR gate has a first input terminal, a second input terminal and an output terminal. The first input terminal of the NOR gate is connected to the output terminal of the first inverter and the second input terminal of the NOR gate is connected to the input terminal of the first inverter. The invert-delay device comprises an odd number of inverters serially connected together. The input terminal of the invert-delay device is connected to the output terminal of the NOR gate. The gate terminal of the PMOS transistor is connected to the output terminal of the invert-delay circuit. The input terminal of the second inverter is connected to the output terminal of the first inverter and the output terminal of the second inverter is used for issuing a data-transition-detected pulse. The low voltage can be an earth connection, for example.

The power shut down signaling circuit includes a first NAND gate, a first inverter, a first PMOS transistor, a first NMOS transistor, a second inverter, a third inverter, a NOR gate, a second PMOS transistor, a second NMOS transistor, a third NMOS transistor, a fourth inverter, a fifth inverter, a sixth inverter, a seventh inverter, a second NAND gate and an eighth inverter. The first NAND gate has two input terminals for receiving the data-transition-detected pulse and the local sense amplifier enable (LSAE) signal. The first inverter receives a global sense amplifier enable (GSAE) signal. The source terminal of the first PMOS transistor is connected to a high voltage and the gate terminal of the first PMOS transistor is connected to the output terminal of the first NAND gate. The drain terminal of the first NMOS transistor is connected to the drain terminal of the first PMOS transistor. The gate terminal of the first NMOS transistor is connected to the first inverter. The source terminal of the first NMOS transistor is connected to a low voltage. The input terminal of the second inverter is connected to the drain terminal of the first NMOS transistor. The input terminal of the third inverter is connected to the output terminal of the second inverter and the output terminal of the third inverter is connected to the input terminal of the second inverter. The NOR gate has two input terminals for receiving the data-transition-detected pulse and signal from the input terminal of the second inverter. The gate terminal of the second PMOS transistor receives the global sense amplifier enable (GSAE) signal. The source terminal of the second PMOS transistor is connected to a high voltage. The gate terminal of the second NMOS transistor is connected to the output terminal of the NOR gate and the drain terminal of the second NMOS transistor is connected to the drain terminal of the second PMOS transistor. The gate terminal of the third NMOS transistor receives the GSAE signal. The drain terminal of the third NMOS transistor is connected to the source terminal of the second PMOS transistor and the source terminal of the third NMOS transistor is connected to a low voltage. The input terminal of the fourth inverter is connected to the drain terminal of the second NMOS transistor. The input terminal of the fifth inverter is connected to the output terminal of the fourth inverter and the output terminal of the fifth inverter is connected to the input terminal of the fourth inverter. The input terminal of the sixth inverter is connected to the input terminal of the fourth inverter. The input terminal of the seventh inverter is connected to the output terminal of the sixth inverter. The second NAND gate has two input terminals. One input terminal of the second NAND gate is connected to the output terminal of the seventh inverter. The other input terminal of the second NAND gate receives the GSAE signal. The input terminal of the eighth inverter is connected to the output terminal of the second NAND gate. The output terminal of the eighth inverter issues the local sense amplifier enable (LSAE) signal. The low voltage can be an earth connection, for example.

This invention also provides an energy-saving device for a type of memory circuit suitable for immediately terminating the sending of a local sense amplifier enable (LSAE) signal to a sense amplifier circuit. The sense amplifier circuit includes an operational signal and an inverse operational signal.

The invention includes a first Schmitt triggering circuit, a second Schmitt triggering circuit, a first data-transmission tester, a second data-transmission tester, a data-transmission-testing pulse-generation circuit and a power shut down signaling circuit.

The first Schmitt triggering circuit receives the operational signal and issues a first Schmitt triggering signal. The second Schmitt triggering circuit receives the inverse operational signal and issues a second Schmitt triggering signal. The first data-transmission tester receives the first Schmitt triggering signal. Any change in the first Schmitt triggering signal is detected so that a corresponding first response signal is issued. The second data-transmission tester receives the second Schmitt triggering signal. Any change in the second Schmitt triggering signal is detected so that a corresponding second response signal is issued. When the data-transmission-testing pulse-generation circuit receives a first response signal or a second response signal, a data-transition-detected pulse is issued. The power shut down signaling circuit is connected to the data-transmission-testing pulse-generation circuit. When the power shut down signaling circuit receives a data-transition-detected pulse, the local sense amplifier enable signal is immediately terminated.

The data transmission-testing pulse generation circuit includes a first NMOS transistor, a second NMOS transistor, a first inverter, a NOR gate, an invert-delay device, a PMOS transistor and a second inverter. The gate terminal of the first NMOS transistor receives the first response signal issued by the first data-transmission tester. The source terminal of the first NMOS transistor is connected to a low voltage. The gate terminal of the second NMOS transistor receives the second response signal issued by the second data-transmission tester. The source terminal of the second NMOS transistor is connected to a low voltage. The input terminal of the first inverter is connected to a low voltage and the output terminal of the first inverter is connected to the drain terminal of the first and the second NMOS transistor. The NOR gate has a first input terminal, a second input terminal and an output terminal. The first input terminal of the NOR gate is connected to the output terminal of the first inverter and the second input terminal of the NOR gate is connected to the input terminal of the first inverter. The invert-delay device comprises an odd number of inverters connected serially together. The input terminal of the invert-delay device is connected to the output terminal of the NOR gate. The gate terminal of the PMOS transistor is connected to the output terminal of the invert-delay device and the source terminal of the PMOS transistor is connected to a high voltage. The drain terminal of the PMOS transistor is connected to the output terminal of the first inverter. The input terminal of the second inverter is connected to the output terminal of the first inverter. The output terminal of the second inverter issues a pulse-triggering signal. The low voltage can be an earth connection, for example.

The power shut down signaling circuit includes a first NAND gate, a first inverter, a first PMOS transistor, a first NMOS transistor, a second inverter, a third inverter, a NOR gate, a second PMOS transistor, a second NMOS transistor, a third NMOS transistor, a fourth inverter, a fifth inverter, a sixth inverter, a seventh inverter, a second NAND gate and an eighth inverter. The first NAND gate has two input terminals for receiving the data-transition-detected pulse and the local sense amplifier enable (LSAE) signal. The first inverter receives a global sense amplifier enable (GSAE) signal. The source terminal of the first PMOS transistor is connected to a high voltage and the gate terminal of the first PMOS transistor is connected to the output terminal of the first NAND gate. The drain terminal of the first NMOS transistor is connected to the drain terminal of the first PMOS transistor. The gate terminal of the first NMOS transistor is connected to the first inverter. The source terminal of the first NMOS transistor is connected to a low voltage. The input terminal of the second inverter is connected to the drain terminal of the first NMOS transistor. The input terminal of the third inverter is connected to the output terminal of the second inverter and the output terminal of the third inverter is connected to the input terminal of the second inverter. The NOR gate has two input terminals for receiving the data-transition-detected pulse and signal from the input terminal of the second inverter. The gate terminal of the second PMOS transistor receives the global sense amplifier enable (GSAE) signal. The source terminal of the second PMOS transistor is connected to a high voltage. The gate terminal of the second NMOS transistor is connected to the output terminal of the NOR gate and the drain terminal of the second NMOS transistor is connected to the drain terminal of the second PMOS transistor. The gate terminal of the third NMOS transistor receives the GSAE signal. The drain terminal of the third NMOS transistor is connected to the source terminal of the second PMOS transistor and the source terminal of the third NMOS transistor is connected to a low voltage. The input terminal of the fourth inverter is connected to the drain terminal of the second NMOS transistor. The input terminal of the fifth inverter is connected to the output terminal of the fourth inverter and the output terminal of the fifth inverter is connected to the input terminal of the fourth inverter. The input terminal of the sixth inverter is connected to the input terminal of the fourth inverter. The input terminal of the seventh inverter is connected to the output terminal of the sixth inverter. The second NAND gate has two input terminals. One input terminal of the second NAND gate is connected to the output terminal of the seventh inverter. The other input terminal of the second NAND gate receives the GSAE signal. The input terminal of the eighth inverter is connected to the output terminal of the second NAND gate. The output terminal of the eighth inverter issues the local sense amplifier enable (LSAE) signal. The low voltage can be an earth connection, for example.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
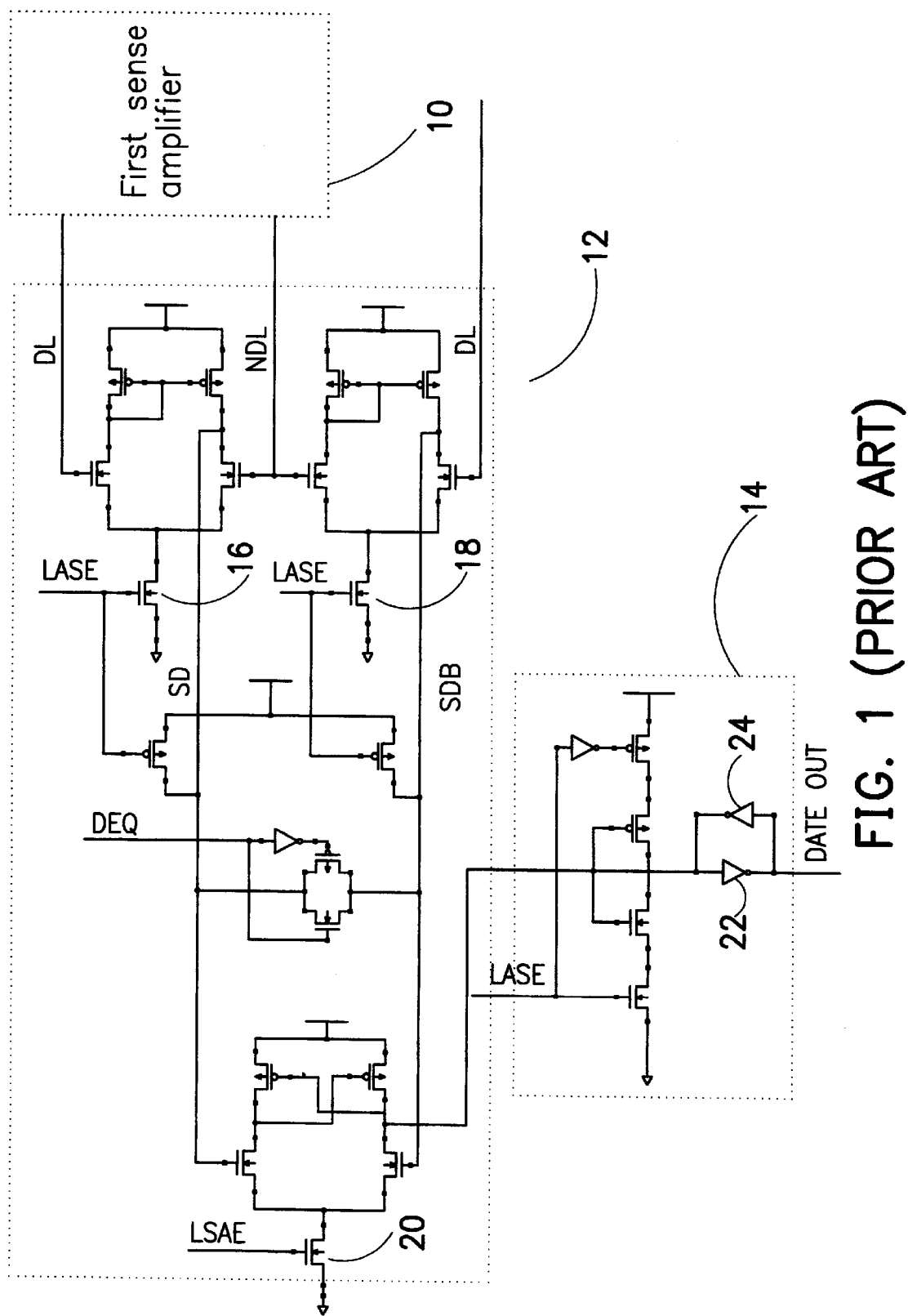
FIG. 1 is a diagram showing a conventional memory circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
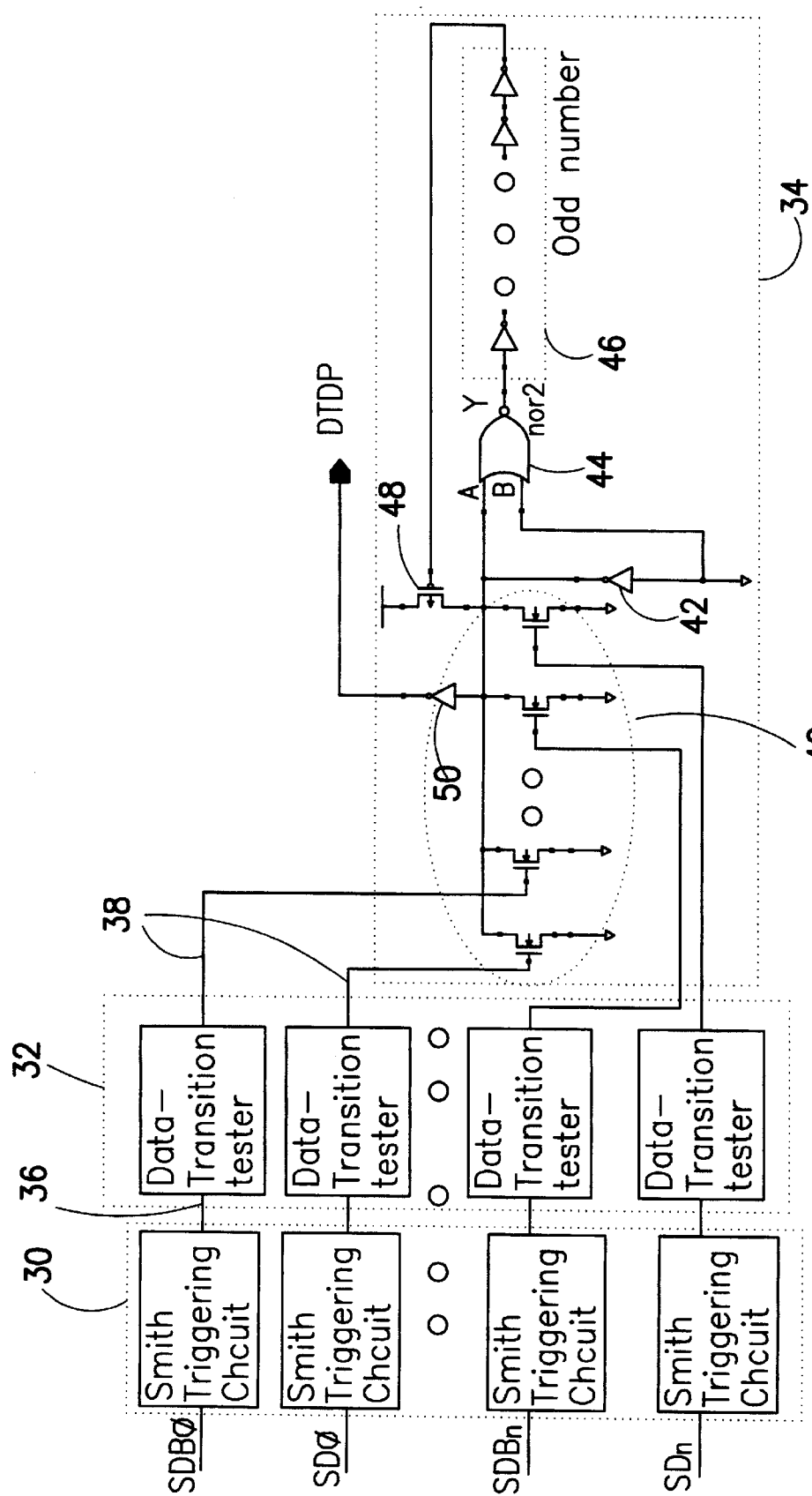
FIGS. 2A and 2B are diagrams showing the circuit components of an energy-saving device to be used inside a memory circuit according to one preferred embodiment of this invention.
Figure 2B:
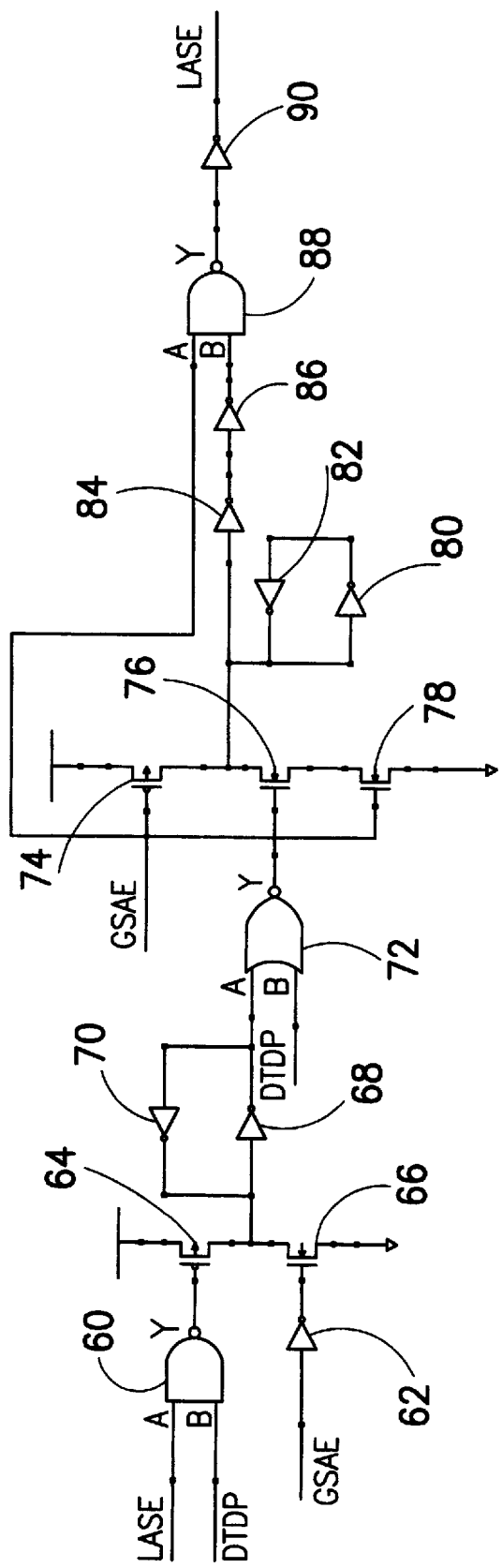

FIGS. 2A and 2B are diagrams showing the circuit components of an energy-saving device to be used inside a memory circuit according to one preferred embodiment of this invention.

As shown in FIG. 2A, the energy-saving device of this invention includes a plurality of Schmitt triggering circuits 30, a plurality of data-transmission testers 32 and a data-transmission-testing pulse-generation circuit 34. FIG. 2B shows a power shut down signaling circuit according to this invention.

As shown in FIG. 1, the gate terminals of the NMOS transistors 16, 18 and 20 inside the second sense amplifier 12 are triggered by the local sense amplifier enable (LSAE) signal. Hence, immediate termination of the LSAE signal is required. The energy-saving device of this invention utilizes the originally present operational signal SD and inverse operational signal SDB inside the second sense amplifier 12 to control the LSAE signal.

Figures 3, 4:
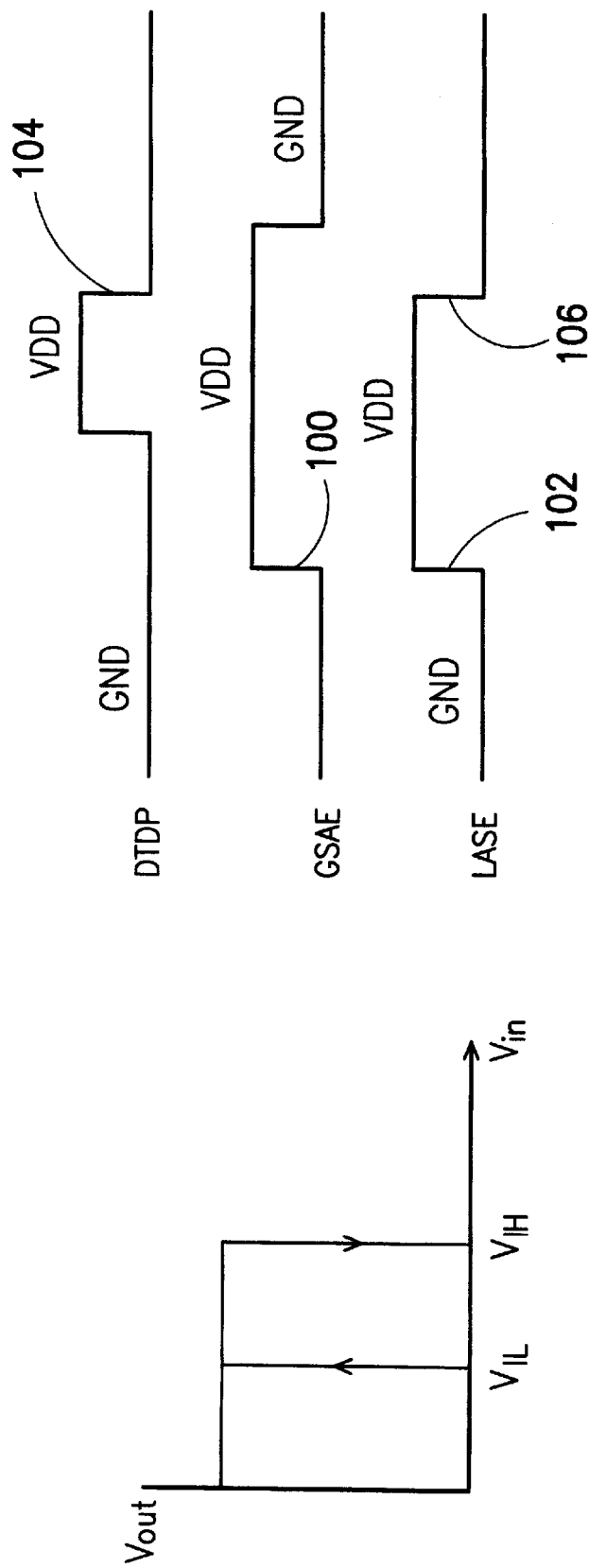
FIG. 3 is a graph showing magnetic hysteresis of a Schmitt triggering circuit.
FIG. 4 is a diagram showing three waveforms produced by the energy-saving device of this invention.

In this invention, the operational signal SD and the inverse operational signal SDB are not limited to just one group. As shown in FIG. 2, there can be a plurality of operational signal lines SD0~SDn and a plurality of inverse operational signal lines SDB0~SDBn with each signal line leading to a Schmitt triggering circuit 30. Each Schmitt triggering circuit 30 is capable of issuing a Schmitt triggering signal 36 to a corresponding data-transmission tester 32. A Schmitt triggering circuit 30 can have some magnetic hysteresis as shown in FIG. 3. Hence, voltages $V_{IL}$ and $V_{IH}$ can be defined to ensure proper latching of the output buffer 14 (as shown in FIG. 1) before the sense amplifier is opened or shut.

After any one of the data-transmission testers 32 shown in FIG. 2A has received a Schmitt triggering signal 36 from a corresponding Schmitt triggering circuit 30, a response signal 38 will be transmitted to a data-transmission-testing pulse-generation circuit 34. When a response signal 38 from any one of the data transmission testers 32 is detected, the data-transmission-testing pulse-generation circuit 34 issues a data-transition-detector pulse (DTDP).

The data-transmission-testing pulse-generation circuit 34 includes a plurality of NMOS transistors 40, a first inverter 42, a NOR gate 44, an invert-delay device 46, a PMOS transistor 48 and a second inverter 50. The gate terminal of each NMOS transistor 40 is connected to the output terminal of a data-transmission tester 32 for receiving a response signal 38. All the source terminals of the NMOS transistors 40 are connected to a low voltage (such as a ground). The input terminal of the first inverter 42 is connected to a low voltage and the output terminal of the first inverter 42 is connected to the drain terminal of the NMOS transistor 40. The NOR gate 44 has a first input terminal B, a second input terminal A and an output terminal Y. The first input terminal B is connected to the output terminal of the first inverter 42 and the second input terminal A is connected to the input terminal of the first inverter 42. The invert-delay device 46 comprises of an odd number of inverters serially connected together. The input terminal of the invert-delay device 46 is connected to the output terminal of the NOR gate 44. The gate terminal of the PMOS transistor is connected to the output terminal of the invert-delay device 46. The source terminal of the PMOS transistor 48 is connected to a high voltage and the drain terminal of the PMOS transistor 48 is connected to the output terminal of the first inverter 42. The input terminal of the second inverter 50 is connected to the output terminal of the first inverter 42. The output terminal of the second inverter 50 issues a data-transition-detected pulse (DTDP).

The power shut down signaling circuit as shown in FIG. 2B is responsible for the immediate shut down of the local sense amplifier enable (LSAE) signal on receiving a DTDP. The power shut down signaling circuit comprises a first NAND gate 60, a first inverter 62, a first PMOS transistor 64, a first NMOS transistor 66, a second inverter 68, a third inverter 70, a NOR gate 72, a second PMOS transistor 74, a second NMOS transistor 76, a third NMOS transistor 78, a fourth inverter 80, a fifth inverter 82, a sixth inverter 84, a seventh inverter, a second NAND gate 88 and an eighth inverter 90.

The first NAND gate 60 has two input terminals, A and B, for receiving the DTDP and the LSAE signal respectively. The first inverter 52 receives a global sense amplifier enable (GSAE) signal. The source terminal of the first PMOS transistor 64 receives a high voltage. The gate terminal of the first PMOS transistor 64 is connected to the output terminal Y of the first NAND gate 60. The drain terminal of the first NMOS transistor 66 is connected to the drain terminal of the first PMOS transistor 64. The gate terminal of the first NMOS transistor 66 is connected to the input terminal of the first inverter 52. The source terminal of the first NMOS transistor 66 is connected to a low voltage. The input terminal of the second inverter 68 is connected to the drain terminal of the first NMOS transistor 66. The input terminal of the third inverter 70 is connected to the output terminal of the second inverter 68. The output terminal of the third inverter 70 is connected to the input terminal of the second inverter 68. The NOR gate 72 has two input terminals. One input terminal of the NOR gate 72 receives the DTDP. The other input terminal of the NOR gate 72 is connected to the input terminal of the second inverter 68. The gate terminal of the second PMOS transistor 76 receives the GSAE signal. The source terminal of the second PMOS transistor 76 is connected to a high voltage. The gate terminal of the second NMOS transistor 76 is connected to the output terminal of the NOR gate 72. The drain terminal of the second NMOS transistor 76 is connected to the drain terminal of the second PMOS transistor 74. The gate terminal of the third NMOS transistor 78 receives the GSAE signal. The drain terminal of the third NMOS transistor 78 is connected to the source terminal of the second NMOS transistor 76 and the source terminal of the third NMOS transistor 78 is connected to a low voltage. The input terminal of the fourth inverter 80 is connected to the drain terminal of the second NMOS transistor 76. The input terminal of the fifth inverter 82 is connected to the output terminal of the fourth inverter 80. The output terminal of the fifth inverter 82 is connected to the input terminal of the fourth inverter 80. The input terminal of the sixth inverter 84 is connected to the input terminal of the fourth inverter 80. The input terminal of the seventh inverter 86 is connected to the output terminal of the sixth inverter 84. The second NAND gate 88 has two input terminals. One input terminal of the second NAND gate 88 is connected to the output terminal of the seventh inverter 86. The other terminal of the second NAND gate 88 receives the GSAE signal. The input terminal of the eighth inverter 90 is connected to the output terminal of the second NAND gate 88. The output terminal of the eighth inverter 90 issues the LSAE signal.

FIG. 4 is a diagram showing three waveforms produced by the energy-saving device of this invention. As shown in FIG. 4, there is a low to high voltage transition in the GSAE signal (labeled 100) when the memory circuit shown in FIG. 1 starts to operate. Thereafter, a low to high voltage transistor in the LSAE signal (labeled 102) is triggered. The high LSAE signal level is maintained until the sense amplifier 12 shown in FIG. 1 has correctly registered the data through a high SD signal and a low SDB inverse signal. When there is any change in the SD or SDB signal, a DTDP (labeled 104) is triggered by the circuit structure shown in FIG. 2A as shown in FIG. 4. Width of the pulse is controlled by the invert-delay device 46. In the high to low voltage transition of the DTDP, the LSAE signal is shut down (labeled 106) using the power shut down signaling circuit shown in FIG. 2B so that some energy is saved.

In summary, the energy-saving device of this invention installed within the memory circuit can immediately end any local sense amplifier enable signal to a sense amplifier circuit so that energy is saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An energy-saving device for a memory circuit capable of immediately terminating local sense amplifier enable signal to a sense amplifier circuit, the sense amplifier circuit further includes a plurality of operational signals and a plurality of corresponding inverse operational signals, comprising:
   - a plurality of Schmitt triggering circuits with each corresponding to an operational signal and an inverse operational signal, and each Schmitt triggering circuit is capable of issuing a Schmitt triggering signal;
   - a plurality of data-transmission testers each capable of receiving a Schmitt triggering signal from the Schmitt triggering circuit, detecting any variation in the Schmitt triggering signal and outputting a response signal accordingly;
   - a data-transmission-testing pulse-generation circuit capable of receiving a response signal from any one of the data-transmission testers and outputting a data-transition-detected pulse; and
   - a power shut down signaling circuit connected to the data-transmission-testing pulse-generation circuit and shutting off the local sense amplifier enable signal immediately on receiving the data-transition-detected pulse.

2. The energy-saving device of claim 1, wherein the data-transmission-testing pulse-generation circuit includes:
   - a plurality of NMOS transistors, wherein each gate terminal of each NMOS transistor is connected to an output terminal of a data-transmission tester for receiving a response signal and each source terminal of each NMOS transistors is connected to a low voltage;
   - a first inverter, wherein an input terminal is connected to a low voltage and the output terminal is connected to a drain terminal of the NMOS transistor;
   - a NOR gate having a first input terminal, a second input terminal and an output terminal, wherein the first input terminal is connected to the output terminal of the first inverter and the second input terminal is connected to the input terminal of the first inverter;
   - an invert-delay device comprising an odd number of inverters serially connected together, wherein the input terminal is connected to the output terminal of the NOR gate;
   - a PMOS transistor, wherein a gate terminal is connected to the output terminal of the invert-delay device, a source terminal is connected to a high voltage and a drain terminal is connected to the output terminal of the first inverter; and
   - a second inverter, wherein an input terminal is connected to the output terminal of the first inverter and the output terminal is connected to a terminal for issuing a data-transition-detected pulse.

3. The energy-saving device of claim 2, wherein the low voltage includes a ground connection.

4. The energy-saving device of claim 1, wherein the power shut down signaling circuit includes:
   - a first NAND gate having two input terminals for receiving the data-transition-detected pulse and the local sense amplifier enable signal;
   - a first inverter for receiving a global sense amplifier enable signal;
   - a first PMOS transistor, wherein a source terminal is connected to a high voltage, a gate terminal is connected to the output terminal of the first NAND gate;

a first NMOS transistor, wherein the drain terminal is connected to the drain terminal of the first PMOS transistor, the gate terminal is connected to the output terminal of the first inverter and the source terminal is connected to a low voltage;

a second inverter, wherein an input terminal is connected to the drain terminal of the first NMOS transistor;

a third inverter, wherein an input terminal is connected to the output terminal of the second inverter and the output terminal is connected to the input terminal of the second inverter;

an NOR gate having two input terminals, wherein one input terminal is connected to a terminal for receiving the data-transition-detected pulse and the other input terminal is connected to the input terminal of the second inverter;

a second PMOS transistor, wherein a gate terminal is connected to a terminal for receiving the global sense amplifier enable signal and a source terminal is connected to a high voltage;

a second NMOS transistor, wherein a gate terminal is connected to the output terminal of the NOR gate and a drain terminal is connected to the drain terminal of the second PMOS transistor;

a third NMOS transistor, wherein a gate terminal is connected to a terminal for receiving the global sense amplifier enable signal, the drain terminal is connected to the source terminal of the second NMOS transistor and the source terminal is connected to a low voltage;

a fourth inverter, wherein an input terminal is connected to the drain terminal of the second NMOS transistor;

a fifth inverter, wherein an input terminal is connected to an output terminal of the fourth inverter and the output terminal is connected to the input terminal of the fourth inverter;

a sixth inverter, wherein an input terminal is connected to the input terminal of the fourth inverter;

a seventh inverter, wherein an input terminal is connected to an output terminal of the sixth inverter;

a second NAND gate having two input terminals, wherein one terminal is connected to the an terminal of the seventh inverter and the other terminal is connected to a terminal for receiving the global sense amplifier enable signal; and an eighth inverter, wherein an input terminal is connected to the output terminal of the second NAND gate and the output terminal is sent to a terminal for sending the local sense amplifier enable signal.

5. The energy-saving circuit of claim 4, wherein the low voltage includes a ground connection.

6. An energy-saving device for a memory circuit capable of immediately ending a local sense amplifier enable signal to a sense amplifier circuit, the sense amplifier circuit includes an operational signal and an inverse operational signal, comprising:

a first Schmitt triggering circuit for receiving the operational signal and outputting a first Schmitt triggering signal;

a second Schmitt triggering circuit for receiving the inverse operational signal and outputting a second Schmitt triggering signal;

a first data-transmission tester for receiving the first Schmitt triggering signal, detecting any change in the first Schmitt triggering signal and outputting a first response signal;

a second data-transmission tester for receiving the second Schmitt triggering signal, detecting any change in the second Schmitt triggering signal and outputting a second response signal;

a data-transmission-testing pulse-generation circuit, wherein a data-transition-detected pulse is issued when either a first response signal or a second response signal is received; and a power shut down signaling circuit connected to the data-transmission-testing pulse-generation circuit, wherein the local sense amplifier enable signal is shut down immediately after the data-transition-detected pulse is received.

7. The energy-saving device of claim 6, wherein the data-transmission testing pulse-generation circuit includes:

a first NMOS transistor, wherein the gate terminal is connected to a terminal for receiving the first response signal from a first data-transmission tester and the source terminal is connected to a low voltage;

a second NMOS transistor, wherein a gate terminal is connected to a terminal for receiving the second response signal from the second data-transmission tester and a source terminal is connected to a low voltage;

a first inverter, wherein an input terminal is connected to a low voltage and an output terminal is connected to a drain terminal of the first and second NMOS transistor;

a NOR gate having a first input terminal, a second input terminal and an output terminal, wherein a first input terminal is connected to the output terminal of the first inverter and the second input terminal is connected to the input terminal of the first inverter;

an invert-delay device comprising an odd number of inverters serially connected together, wherein an input terminal is connected to the output terminal of the NOR gate;

a PMOS transistor, wherein a gate terminal is connected to an output terminal of the invert-delay device, a source terminal is connected to a high voltage and a drain terminal is connected to the output terminal of the first inverter; and a second inverter, wherein an input terminal is connected to the output terminal of the first inverter and the output terminal is connected to a terminal for outputting the data-transition-detected pulse.

8. The energy-saving device of claim 7, wherein the low voltage includes a ground connection.

9. The energy-saving device of claim 6, wherein the power shut down signaling circuit includes:

a first NAND gate having two input terminals for receiving the data-transition-detected pulse and the local sense amplifier enable signal;

a first inverter for receiving a global sense amplifier enable signal;

a first PMOS transistor, wherein a source terminal is connected to a high voltage, a gate terminal is connected to an output terminal of the first NAND gate;

a first NMOS transistor, wherein a drain terminal is connected to a drain terminal of the first PMOS transistor, a gate terminal is connected to an output terminal of the first inverter and the source terminal is connected to a low voltage;

a second inverter, wherein an input terminal is connected to the drain terminal of the first NMOS transistor;

a third inverter, wherein an input terminal is connected to an output terminal of the second inverter and the output terminal is connected to the input terminal of the second inverter;

an NOR gate having two input terminals, wherein one input terminal is connected to a terminal for receiving the data-transition-detected pulse and the other input terminal is connected to the input terminal of the second inverter;

a second PMOS transistor, wherein a gate terminal is connected to a terminal for receiving the global sense amplifier enable signal and a source terminal is connected to a high voltage;

a second NMOS transistor, wherein a gate terminal is connected to the output terminal of the NOR gate and a drain terminal is connected to a drain terminal of the second PMOS transistor;

a third NMOS transistor, wherein the gate terminal is connected to a terminal for receiving the global sense amplifier enable signal, a drain terminal is connected to a source terminal of the second NMOS transistor and the source terminal is connected to a low voltage;

a fourth inverter, wherein an input terminal is connected to the drain terminal of the second NMOS transistor;

a fifth inverter, wherein an input terminal is connected to an output terminal of the fourth inverter and the output terminal is connected to the input terminal of the fourth inverter;

a sixth inverter, wherein an input terminal is connected to the input terminal of the fourth inverter;

a seventh inverter, wherein an input terminal is connected to an output terminal of the sixth inverter;

a second NAND gate having two input terminals, wherein one terminal is connected to the output terminal of the seventh inverter and the other terminal is connected to a terminal for receiving the global sense amplifier enable signal; and an eighth inverter, wherein an input terminal is connected to the output terminal of the second NAND gate and the output terminal is sent to a terminal for sending the local sense amplifier enable signal.

10. The energy-saving device of claim 9, wherein the low voltage includes a ground connection.

\* \* \* \* \*